(12) United States Patent
Son

(10) Patent No.: US 8,704,263 B2
(45) Date of Patent: Apr. 22, 2014

(54) LIGHT EMITTING APPARATUS WITH AN OPENING PART, MANUFACTURING METHOD THEREOF, AND LIGHT UNIT

(75) Inventor: Won Jin Son, Gwangsan-gu (KR)

(73) Assignee: LG Innotek Co., Ltd., Seoul (KR)

( * ) Notice: Subject to any disclaimer, the term of this patent is extended or adjusted under 35 U.S.C. 154(b) by 306 days.

(21) Appl. No.: 11/844,837

(22) Filed: Aug. 24, 2007

(65) Prior Publication Data

US 2008/0048203 A1 Feb. 28, 2008

(30) Foreign Application Priority Data

Aug. 24, 2006 (KR) .......................... 10-2006-0080216

(51) Int. Cl.
*H01L 33/00* (2010.01)

(52) U.S. Cl.
USPC ........................................................... 257/99

(58) Field of Classification Search
USPC ............. 257/99, 666, 100, 95, 98, 81–82, 88, 257/79, E51.018, E51.019, E51.02, 257/E51.022, E33.001, E33.066, E33.072
See application file for complete search history.

(56) References Cited

U.S. PATENT DOCUMENTS

| 6,243,508 | B1 * | 6/2001 | Jewell et al. ..................... 385/14 |
| 6,696,764 | B2 * | 2/2004 | Honda ........................... 257/778 |
| 6,707,069 | B2 * | 3/2004 | Song et al. ...................... 257/79 |
| 2005/0139846 | A1 * | 6/2005 | Park et al. ....................... 257/98 |
| 2006/0157722 | A1 * | 7/2006 | Takezawa et al. ............... 257/98 |

FOREIGN PATENT DOCUMENTS

| JP | 2002-076161 A | 3/2002 |
| JP | 2003-281912 A | 10/2003 |
| JP | 2005-197633 A | 7/2005 |
| JP | 2005-112345 | 7/2006 |

* cited by examiner

*Primary Examiner* — Hoa B Trinh
(74) *Attorney, Agent, or Firm* — Saliwanchik, Lloyd & Eisenschenk

(57) ABSTRACT

Provided are a light emitting apparatus and a light unit. The light emitting apparatus comprises a first substrate, a second substrate, and a light emitting device. The first substrate has a plurality of lead frames, and the second substrate has an opening part on the first substrate. The light emitting device is mounted on a portion of the first substrate that is below the opening part. The light unit comprises at least one light emitting apparatus and an optical member on a light emitting path of the light emitting apparatus.

19 Claims, 11 Drawing Sheets

LIGHT EMITTING APPARATUS WITH AN OPENING PART, MANUFACTURING METHOD THEREOF, AND LIGHT UNIT

CROSS-REFERENCE TO RELATED APPLICATIONS

The present application claims the benefit under 35 U.S.C. §119 of Korean Patent Application No. 10-2006-0080216, filed Aug. 24, 2006, which is hereby incorporated by reference in its entirety.

BACKGROUND

A light emitting diode (LED) forms a light emitting source using a compound semiconductor material such as GaAs-based materials, AlGaAs-based materials, GaN-based materials, InGaN-based materials, and InGaAlP-based materials to realize various colors.

The LED is packaged and used as a light emitting apparatus. The light emitting apparatus is used as a light source in a variety of applications such as lighting displays, character displays, and image displays displaying colors.

BRIEF SUMMARY

Embodiments of the present invention provide a light emitting apparatus that can improve central luminous intensity of a light emitting device, and a manufacturing method thereof.

Embodiments of the present invention provide a light emitting apparatus that can improve central luminous intensity by mounting a light emitting device on a lower substrate of two or more stacked substrates, and forming an opening part having three open sides and a double-sided reflection frame on an upper substrate of the substrates, a manufacturing method thereof, and a light unit.

An embodiment provides a light emitting apparatus comprising: a first substrate comprising a plurality of lead frames; a second substrate comprising an opening part on the first substrate; and a light emitting device on a portion of the first substrate that is below the opening part.

Another embodiment provides a light unit comprising: at least one light emitting apparatus; and an optical member on a light emitting path of the light emitting apparatus, wherein the light emitting apparatus comprises: a first substrate comprising a plurality of lead frames; a second substrate comprising an opening part on the first substrate; and a light emitting device connected to the lead frames of the first substrate below the opening part.

An embodiment provides a method for manufacturing a light emitting apparatus, the method comprising: forming a plurality of lead frames on a first substrate; stacking a second substrate comprising an opening part on the first substrate; and mounting a light emitting device on the lead frames of the first substrate below the opening part.

The details of one or more embodiments are set forth in the accompanying drawings and the description below. Other features will be apparent from the description and drawings, and from the claims.

DETAILED DESCRIPTION

Reference will now be made in detail to the embodiments of the present disclosure, examples of which are illustrated in the accompanying drawings.

Figure 1:
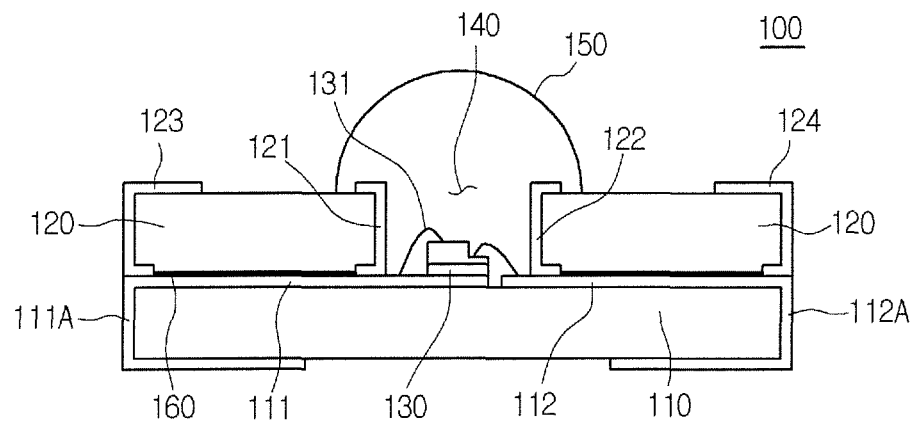
FIG. 1 is a side cross-sectional view of a light emitting apparatus according to an embodiment of the present invention.
Figure 2:
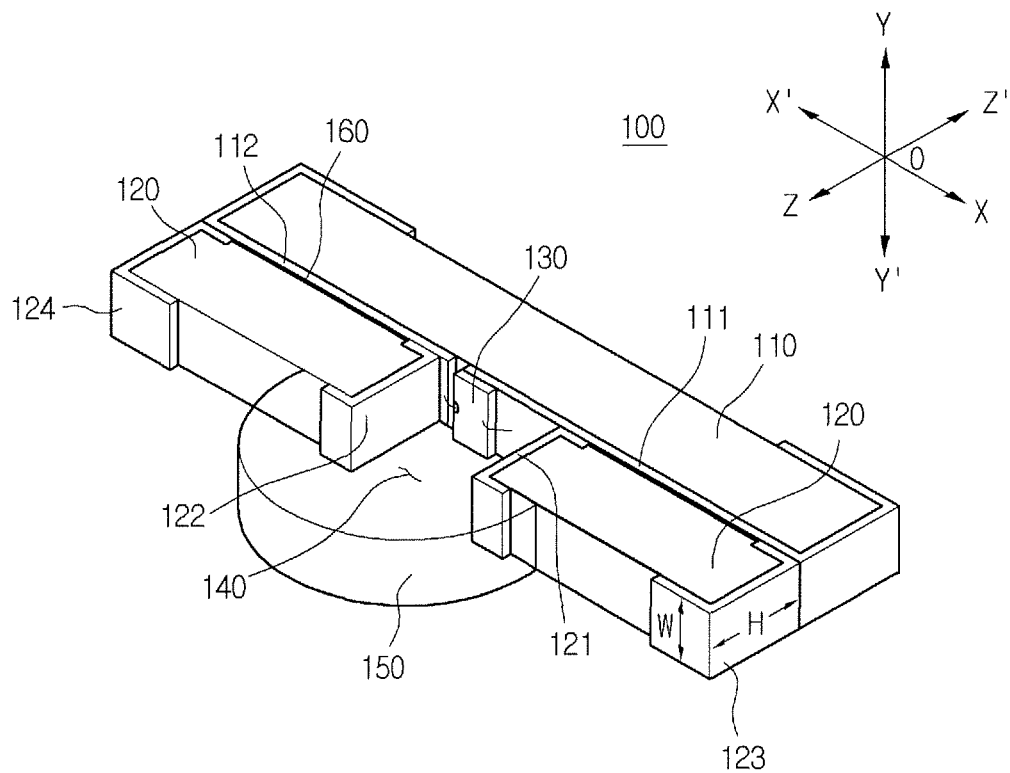
FIG. 2 is a perspective view of a light emitting apparatus according to an embodiment of the present invention.

FIG. 1 is a side cross-sectional view of a light emitting apparatus according to an embodiment. FIG. 2 is a perspective view of the light emitting apparatus of FIG. 1.

Referring to FIGS. 1 and 2, a light emitting apparatus 100 can include a first substrate 110, a second substrate 120, a light emitting device 130, and a mold member 150.

The second substrate 120 can be stacked on the first substrate 110. In one embodiment the first and second substrates 110 and 120 are metal core printed circuit boards (MCPCBs). In another embodiment, the first and second substrates 110 and 220 are chip-on-boards (COBs). A metal plate can be formed on a single side or both sides of the substrate. Each of the substrates can be formed of FR-4 or a plastic resin.

A plurality of lead frames 111 and 112 that are electrically open are formed along an outer surface of the first substrate 110. The lead frames 111 and 112 can be formed by etching the metal plate formed on the first substrate 110 in desired patterns. A plated layer can be formed on the surfaces of the lead frames 111 and 112 through electroplating or electroless plating. Here, the lead frames 111 and 112 can be formed of, for example, a conductive metal including Ag, Au, and Cu, or combination thereof. Also, the lead frames 111 and 112, which are positive (+)/negative (−) electrodes of the first substrate 110, can serve as external lead frames 111A and 112A.

An opening part 140 can be formed in the center of the second substrate 120. Accordingly, the second substrate 120 is disposed to each side of the opening part 140.

The opening part 140 of the second substrate 120 can be formed such that three sides of the light emitting apparatus 100 are open (for example, U-shape) to provide a light emitting path of light generated from the light emitting device 130.

That is, the opening part 140 has a structure that is open in a horizontal direction (Y, Y'), and a vertical direction (Z) from the center 0 of the second substrate 120. The opening part 140 can have the same height as the height H of the second substrate 120, and has the same width as the width W of the second substrate 120.

In a further embodiment, reflection frames 121 and 122 can be formed on both sidewalls of the opening part 140 of the second substrate 120. The reflection frames 121 and 122 on both sidewalls of the opening part 140 reflect light emitted from the light emitting device 130. The reflection frames 121 and 122 can be formed as plated layers by performing electroplating or electroless plating of the metal plate of the second substrate 120. The reflection frames 121 and 122 can be formed of the same material as those of the lead frames 111 and 112. In one embodiment, a material having excellent reflection characteristics including, for example, Ag, Au, Cu, and Al can be coated on the reflection frames 121 and 122.

The reflection frames 121 and 122 and outer frames 123 and 124 are disposed on the inner walls and outer walls of the second substrate 120 that are separated by the opening part 140. Both ends of the reflection frames 121 and 122 and the outer frames 123 and 124 can be bent along the upper surface and the lower surface of the second substrate 120.

An adhesive member 160 is formed between the first and second substrates 110 and 120. The adhesive member 160 integrally fixes the second substrate 120 on the first substrate 110. The adhesive member 160 can be, for example, a bond sheet for substrate adhesion or an epoxy.

The light emitting device 130 is connected to the lead frames 111 and 112 of the first substrate 110 that are exposed below the opening part 140 of the second substrate 120.

The light emitting device 130 can be mounted on one of the lead frames 111 and 112, and electrically connected to respective lead frames 111 and 112 via wires 131. Here, the number of wires (e.g. one or more) or a chip mounting type (e.g. flip-chip type) can be modified as appropriate to connect the light emitting device 130 to the lead frames 111 and 112, and not being limited to any particular configuration.

The light emitting device 130 comprises at least one light emitting diode (LED). The light emitting diode can be realized by selectively using a compound semiconductor material such as GaAs, AlGaAs, GaN, InGaN, or AlGaInP. The light emitting diode can be packaged in primary color (red, blue, and green) LEDs or a white LED.

Also, the light emitting diode 130 and a protecting device (e.g., a zener diode) for protecting the light emitting diode 130 can be mounted together on the first substrate 110.

A mold member 150 can be formed in a portion of the opening part 140 around the light emitting diode 130. The mold member 150 is formed of epoxy and/or silicon and can act as a lens. Here, the mold member 150 can be formed of a transparent material can optionally include a florescent substance. Also, the mold member 150 can be formed in a predetermined shape to the upper direction of the opening part 140 of the second substrate 120. For example, the mold member 150 can be formed in a convex shape, a flat shape, or a concave shape depending on the shape of the surface thereof.

The mold member 150 can fill a portion of the opening part 140 that ranges from the surroundings of the light emitting device 130 up to the outer edge of the opening part 140. The mold member 150 can be used to inhibit the metal lead frames 111 and 112, the reflection frames 121 and 122, and the wires 131 from being exposed to the outside.

In one embodiment, the first substrate 110, the second substrate 120, the opening part 140, and the mold member 150 are formed to have the same width W in the light emitting apparatus 100.

The central luminous intensity of the light emitting apparatus 100 along a vertical direction (z-axis direction) improves due to the reflection frames 121 and 122, and the mold member 150. Also, regarding light emitted along an open horizontal direction (Y, Y') where the reflection frames 121 and 122 have not been formed, a light loss can be minimized by using the reflection members disposed at the outer side of a package.

FIGS. 3 to 9 are views explaining a manufacturing process of a light emitting apparatus according to an embodiment.

Figure 3:
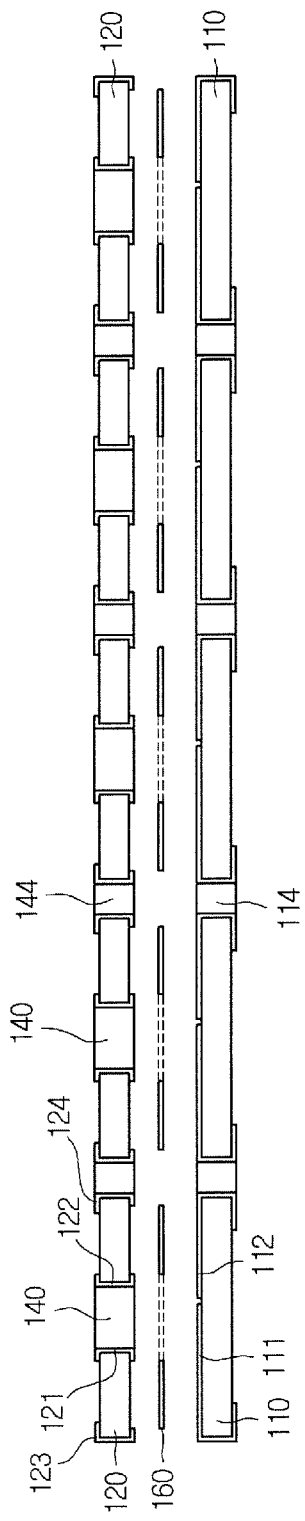
FIGS. 3 to 6 are views illustrating a manufacturing process of a light emitting apparatus according to an embodiment of the present invention.
Figure 4:
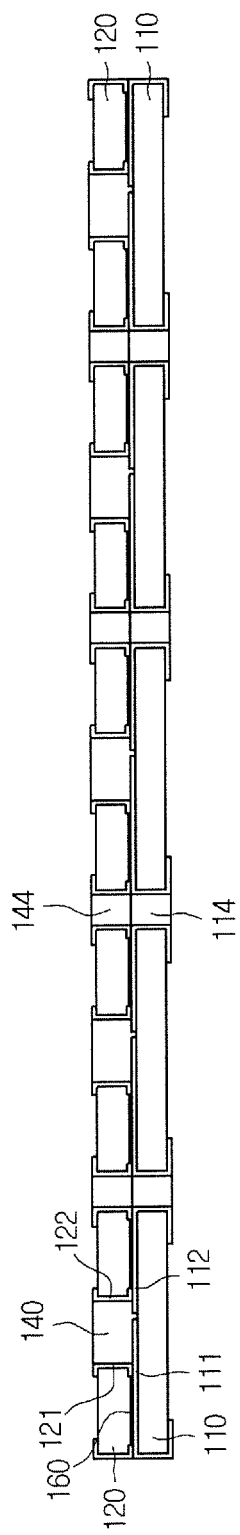

FIG. 3 is an exploded cross-sectional view of the first and second substrates, and FIG. 4 illustrates a structure including the second substrate stacked on the first substrate.

Referring to FIG. 3, first via holes 114 are formed in the first substrate at a package interval, and patterns of the lead frames 111 and 112 can be formed through an etching process.

Second via holes 144 corresponding to the first via holes 114 are formed in the second substrate 120 at the package interval, and opening parts 140 are formed in the central portions between second via holes 144 of the second substrate 120. Patterns of the reflection frames 121 and 122 and the outer frames 123 and 124 can be formed on the second substrate 120 through an etching process.

Referring to FIG. 4, after an adhesive member 160 having predetermined patterns is attached on the first substrate 110, the second substrate 120 can be attached on the first substrate 110. At this point, the first and second substrates 110 and 120 are attached to each other using the adhesive member 160, and integrally coupled to each other using predetermined heat and pressure. Here, the adhesive member 160 can be a bond sheet for substrate adhesion or an epoxy.

An embodiment of the first and second substrates can be described with reference to FIGS. 7 and 8.

Figure 7:
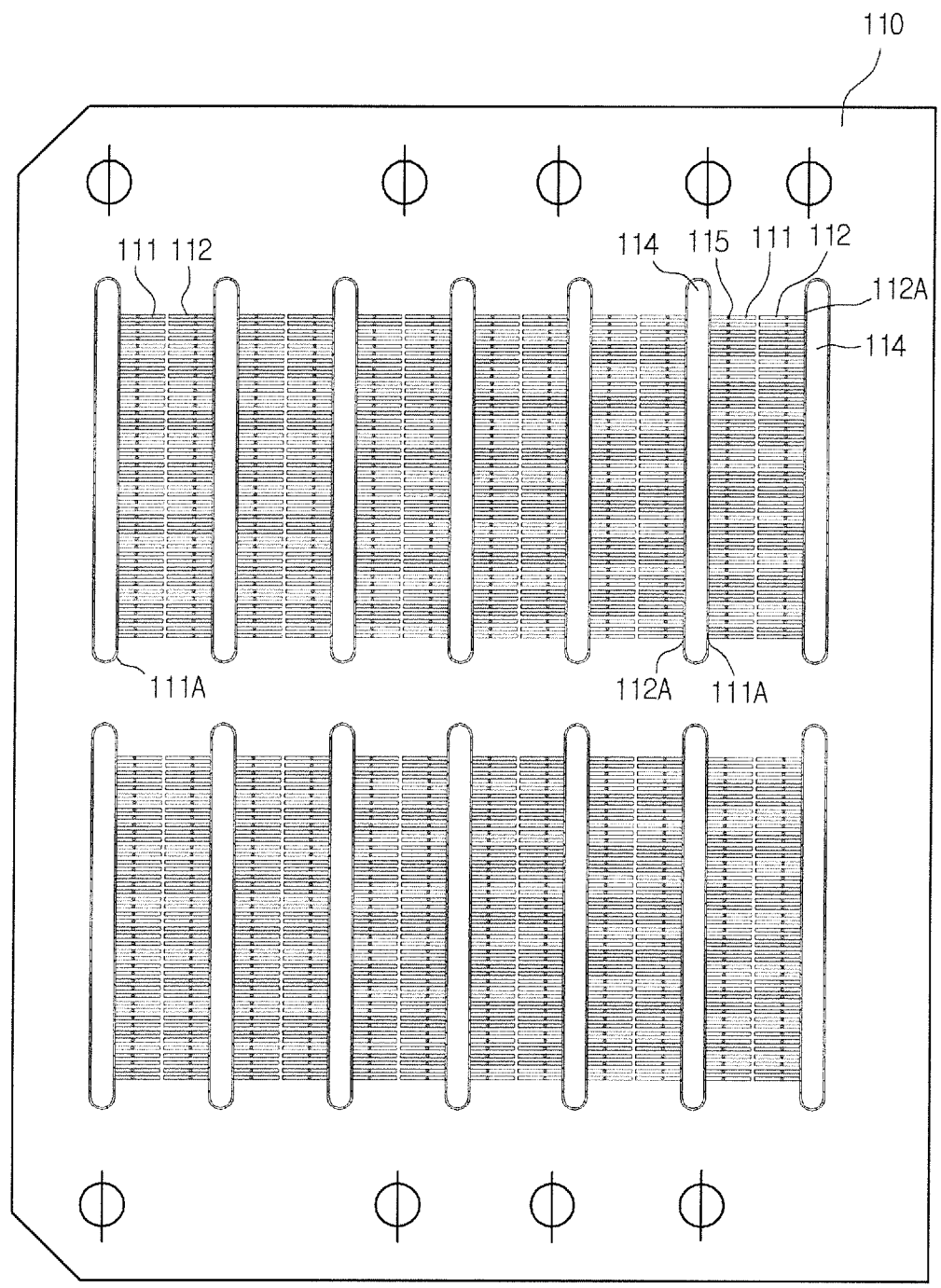
FIG. 7 is a plan view of a first substrate in a light emitting apparatus according to an embodiment of the present invention.

Referring to FIG. 7, the first substrate 110 can include a plurality of first via holes 114 having predetermined length and width. The plurality of first via holes 114 can be formed at a package interval through a drill process. The lead frames 111 and 112 extend from side lead frames 111A and 112A of the first via hole 114 and are electrically open. A plurality of lead frames 111 and 112 can be formed having the width of a package along the first via hole 114.

Heatsink holes 115 can be formed in predetermined portions of the lead frames 111 and 112. The heatsink holes 115 radiate heat generated from the light emitting device.

Figure 8:
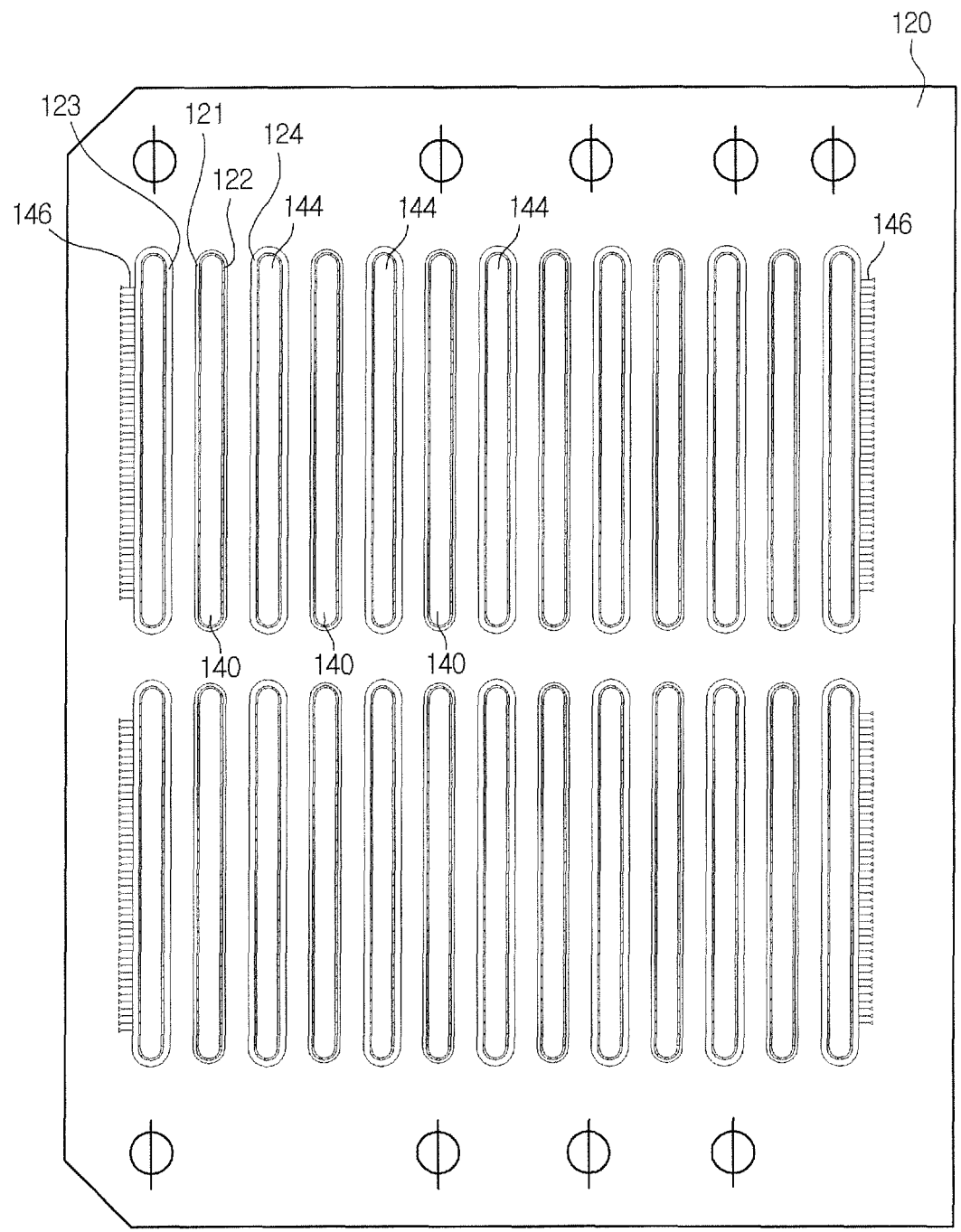
FIG. 8 is a plan view of a second substrate in a light emitting apparatus according to an embodiment of the present invention.

Referring to FIG. 8, the second substrate 120 can include a plurality of second via holes 144 having predetermined length and width. The plurality of second via holes 144 can be formed at a package interval through a drill process. Here, the second via holes 144 are formed in regions corresponding to the first via holes 114 of the first substrate 110 of FIG. 7.

Opening parts 140 can be formed between the second via holes 144 of the second substrate 120. The opening parts 140 can be formed in the same length and width as that of the second via holes 144.

Also, a plurality of cutting lines 146 can be formed in the outer side of the second substrate 120 along a second via hole 144 at an outer region of the second substrate 120. The cutting line 146 can be set by a package unit having one light emitting device or a package unit having two or more light emitting devices. For example, in the case of a package having one light emitting device (e.g., red, green, or blue LED), the second substrate can be cut by one package unit. In the case of a package having three light emitting devices, the second substrate can be cut by a three-unit (e.g., red/green/blue LEDs). This cutting size can be changed depending on a selected package.

Figure 5:
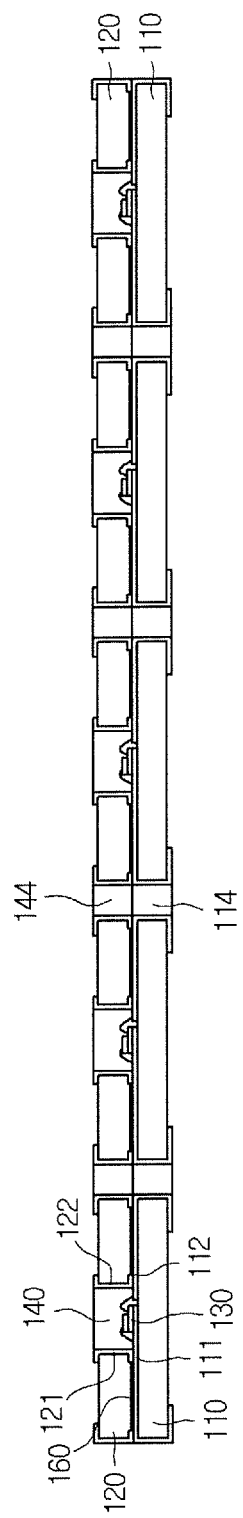

FIG. 5 is a cross-sectional view illustrating a structure in which a light emitting device is mounted on the first substrate in FIG. 4.

Referring to FIG. 5, a light emitting device 130 is mounted on the lead frame 111 of the first substrate 110 that is exposed below the opening part 140 of the second substrate 120. The light emitting device 130 and the plurality of lead frames 111 and 112 can be electrically connected via the wires 131.

Figure 6:
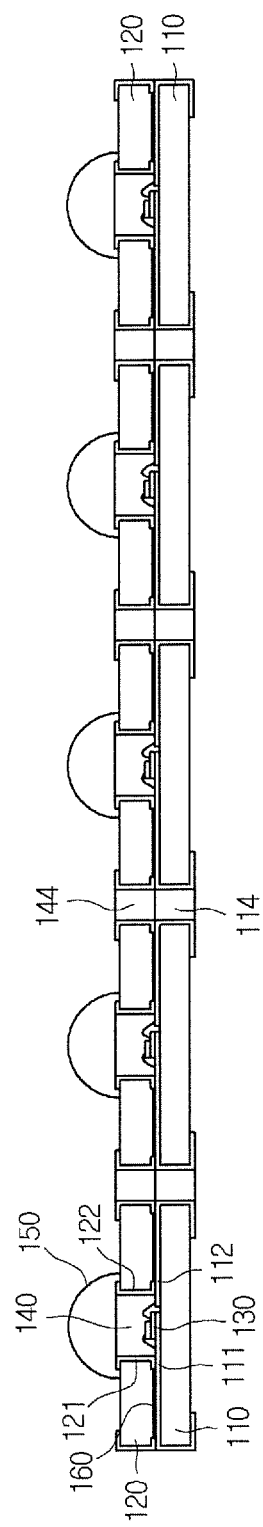
Figure 9:
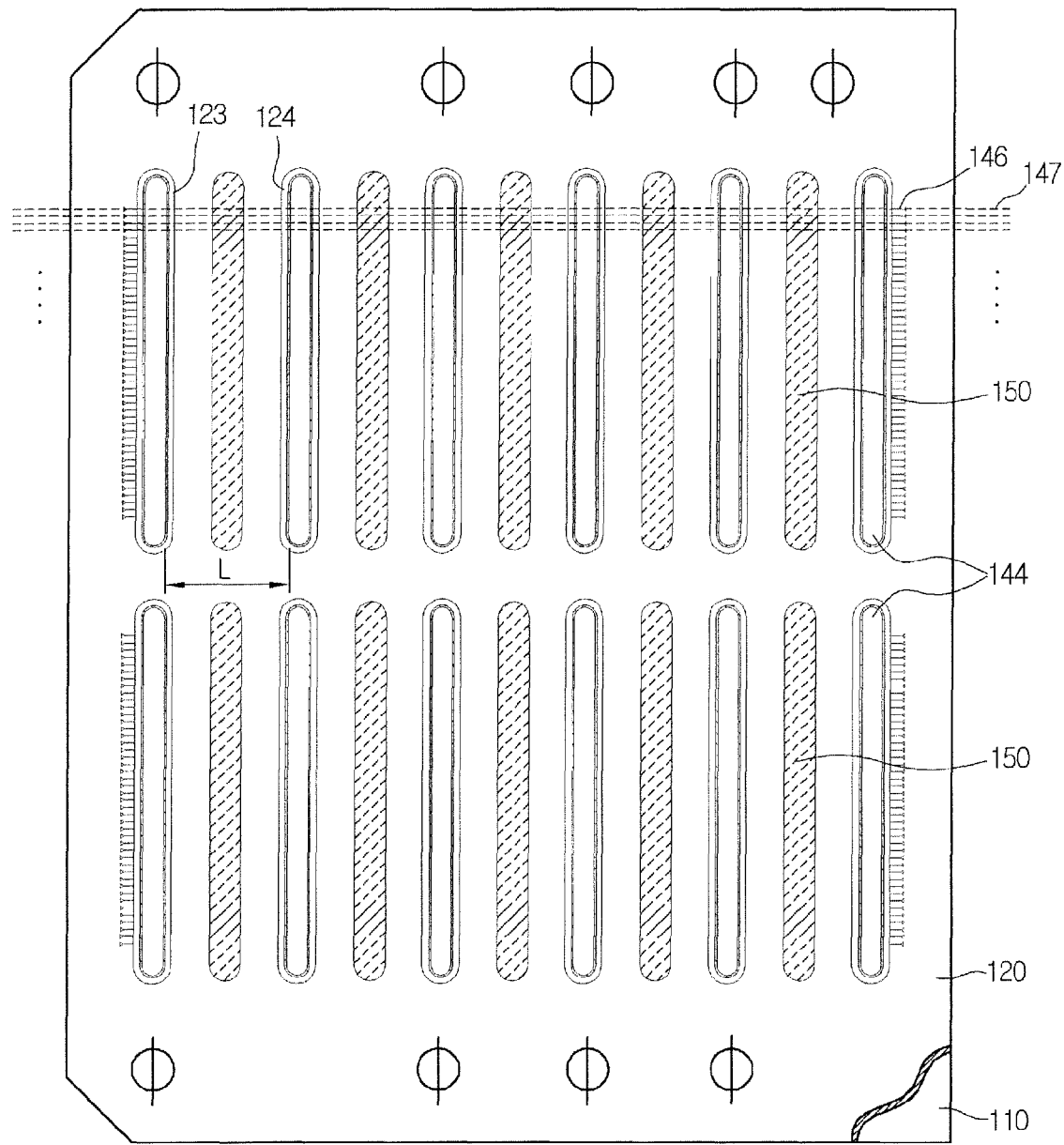
FIG. 9 is a plan view illustrating an example where a mold member is formed in an opening part of a second substrate on a first substrate in a light emitting apparatus according to an embodiment of the present invention.

FIG. 6 is a view illustrating a mold member 150 formed in an opening part 140 of the device of FIG. 5, and FIG. 9 is a plan view of the second substrate where the mold member is formed.

Referring to FIG. 6, the mold member 150 can be formed in the opening part 140 on the first substrate 110 on which the light emitting device 130 is mounted. In an embodiment, the mold member 150 formed in the opening part is formed in a predetermined shape using transparent epoxy or silicon, and then cured, and a fluorescent material can be added when needed. The light emitting device 130 is mounted on the first substrate 110, and the mold member 150 is formed on the light emitting apparatus 130 as described above, so that the light emitting apparatus is completed in a structure where light emitting devices 130 are formed in an array.

Here, referring to FIG. 9, the first substrate 110 is stacked under the second substrate 120, and the molding member 150 is formed in the opening part 140. The second substrate 120 can be cut by a selected package unit along the cutting line 146 formed in the outer side of the second substrate 120. The cutting line 146 can be cut by a package unit having one or more light emitting devices.

Figure 10:
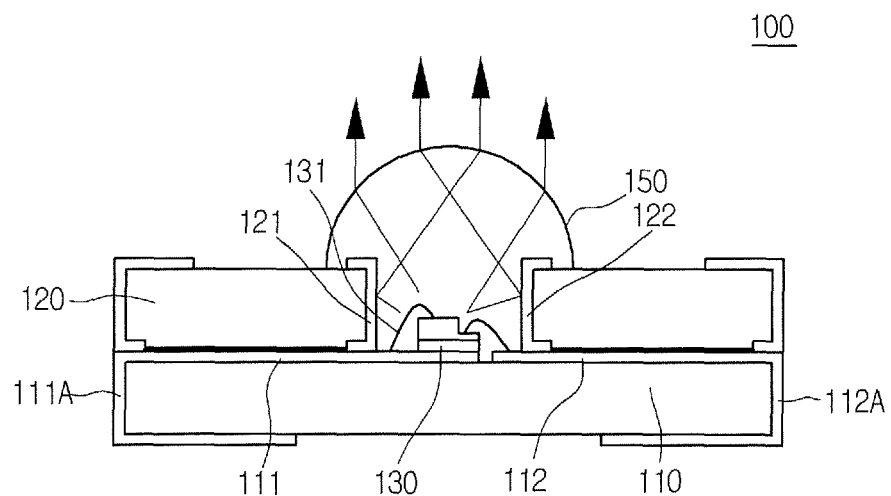
FIG. 10 is a view illustrating light distribution of a light emitting apparatus according to an embodiment of the present invention.

FIG. 10 is a view illustrating light distribution of a light emitting apparatus according to an embodiment.

Referring to FIG. 10, light from the light emitting device 130 can be directly emitted to the outside through the mold member 150, or reflected by the reflection frames 121 and 122 and then emitted.

Figure 11:
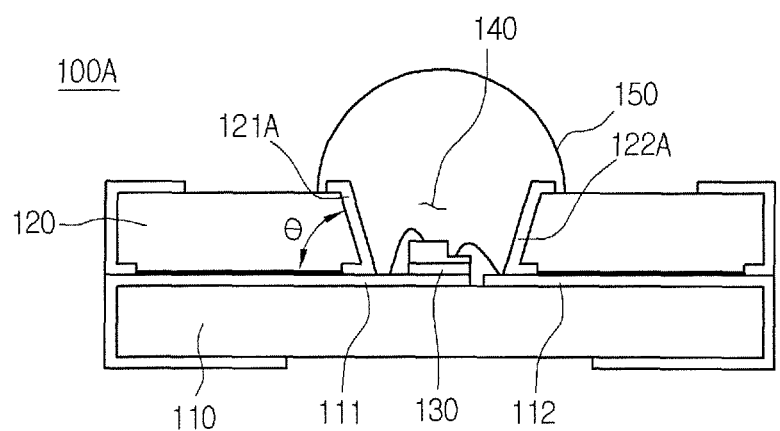
FIG. 11 is a cross-sectional view illustrating a second example of a light emitting apparatus according to an embodiment of the present invention.

FIG. 11 is a cross-sectional view illustrating a second structure of a light emitting apparatus according to an embodiment. Same reference numerals are used for the same parts as those of FIG. 1, and descriptions thereof are omitted.

Referring to FIG. 11, a light emitting apparatus 100A comprises reflection frames 121A and 122A of the second substrate 120. The reflection frames 121A and 122A are formed to have an inclined structure. That is, the reflection frames 121A and 122A are formed to be inclined to the outside by a predetermined angle, so that a distance between the reflection frames 121A and 122A increases from the lower portion to the upper portion of the opening part 140. A direction in which light is emitted can be controlled using the inclined structure of the reflection frames 121A and 122A.

Figure 12:
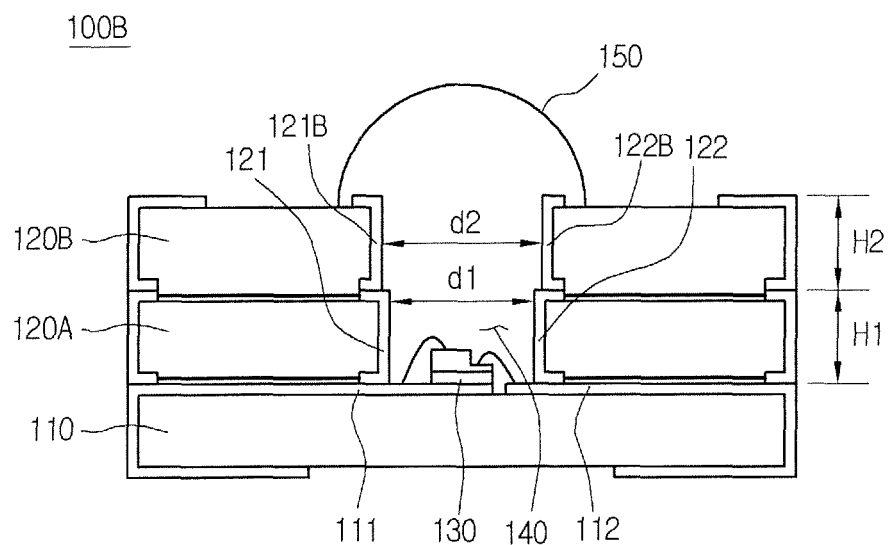
FIG. 12 is a cross-sectional view illustrating a third example of a light emitting apparatus according to an embodiment of the present invention.

FIG. 12 is a cross-sectional view illustrating a third structure of a light emitting apparatus according to an embodiment. Same reference numerals are used for the same parts as those of FIG. 1, and descriptions thereof are omitted.

Referring to FIG. 12, a light emitting apparatus 100B has a structure where a plurality of substrates (120A and 120B) is stacked on a first substrate 110.

The second substrate 120A and the third substrate 120B can be sequentially stacked on the first substrate 110. Opening parts 140 of the first and second substrates 120A and 120B can be formed in the same or different size. For example, a distance d1 between reflection frames 121 and 122 of the second substrate 120A can be narrower than a distance d2 between reflection frames 121B and 122B of a third substrate 120B. By doing so, opening parts of the second substrate 120A and the third substrate 120B can be formed to a stepped structure, so that central distribution of emitted light can extend.

The number of substrates stacked on the first substrate 110 or the shape of the mold member can be selected as desired. In a further embodiment, the first substrate 110 can have an opening part formed in a groove shape where a lead frame is formed in the opening part. Then, a light emitting device can be mounted on the lead frame in the opening part. Also, the height H1 of the second substrate 120A can be different from the height H2 of the third substrate 120B.

A light emitting apparatus (100, 100A, and 100B) according to the above-described embodiments can be applied to backlight units or front light units (referred to as light units hereinafter) of image display devices (e.g., liquid crystal display (LCD) devices). That is, since LC panels of the LCD devices on which characters or figures are displayed are non-luminous devices, the light emitting apparatus can be used as a light unit for illuminating light from the rear side of or below the LC panel.

The light unit used for the image display device is roughly classified into two kinds of light units. The first kind of light unit is an edge type (or side type) light unit providing light from the lateral side of an LC panel, and the second kind of light unit is a direct type light unit directly providing light from below an LC panel. This discrimination is determined by the position of a light source providing light.

Figure 13:
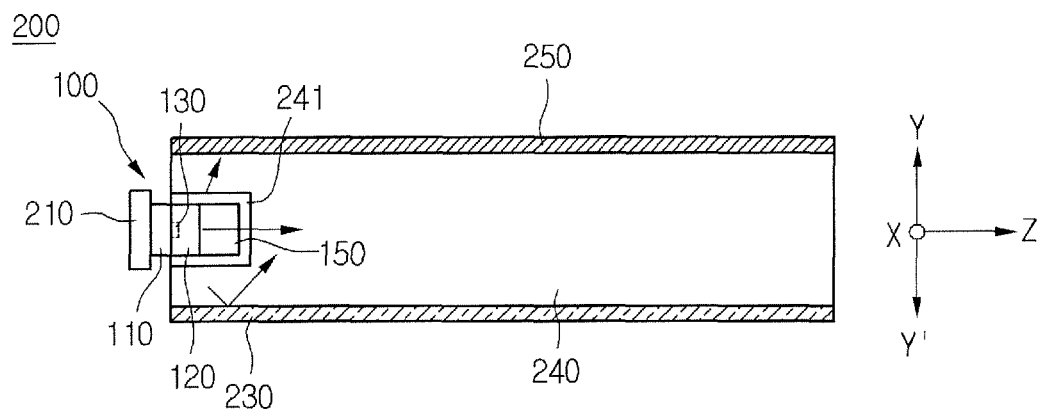
FIG. 13 is a side cross-sectional view of an edge type light unit having a light emitting apparatus according to an embodiment of the present invention.

FIG. 13 is a cross-sectional view of an edge type light unit having a light emitting apparatus according to an embodiment.

Referring to FIG. 13, an edge type light unit 200 according to an embodiment comprises a light emitting apparatus 100, a control substrate 210, a reflection sheet 230, a light guide plate 240, and an optical sheet 250. Other embodiments of the light emitting apparatus can be used for the light emitting apparatus 100, e.g. apparatus 100A and 100B.

A plurality of light emitting apparatuses 100 can be electrically connected to the control substrate 210. A lead frame of the first substrate 110 can be electrically connected to the control substrate 210. In many embodiments, the control substrate 210 can be realized using a flexible material.

Since the light emitting apparatus 100 comprises an opening part having three open sides, it can be inserted into an insertion recess 241 formed in a light incident portion of the light guide plate 240. Here, even the second substrate 120 of the light emitting apparatus 100 can be inserted into the insertion recess 241 of the light guide plate 240.

The reflection sheet 230 is disposed under the light guide plate 240 and the light emitting apparatus 100 to reflect light leaking downward.

The optical sheet 250 is disposed on the light guide plate 240. The optical sheet 250 can include at least one of a diffusion sheet, a horizontal prism sheet, and a vertical prism sheet, but is not limited thereto.

Light generated from the light emitting apparatus 100 of the light unit 200 is incident onto the light guide plate 240 and reflected by the reflection sheet 230, and then emitted as plane light. The uniformity of brightness is improved by the optical sheet 250.

In one embodiment, light from the light emitting device 130 of the light emitting apparatus 100 is emitted to have straightness with respect to a vertical direction (z-axis), and emitted in side directions with respect to a horizontal direction (Y, Y'). At this point, a portion of light emitted to the horizontal downward direction (Y') is reflected by the reflection sheet 230 located under the light guide plate 240, and changes its progression path to a panel direction.

As described above, at least one of the light guide plate, the diffusion sheet, and the prism sheet, which are optical members, is disposed on a light emitting path of the light emitting apparatus 100, and light that leaks to one side of the light emitting apparatus 100 can be reflected using the reflection sheet or a reflector.

Figure 14:
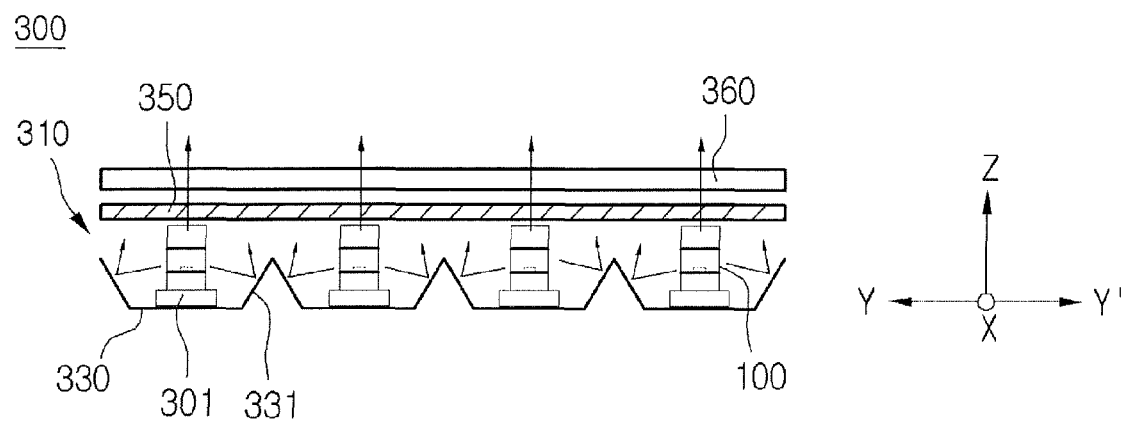
FIG. 14 is a side cross-sectional view of a liquid crystal display (LCD) device using a direct type light unit having a light emitting apparatus according to an embodiment of the present invention.

FIG. 14 is a cross-sectional view illustrating an LCD device 300 using a direct type light unit having a light emitting apparatus according to an embodiment.

Referring to FIG. 14, the LCD device 300 comprises a direct type light unit 310 and an LC panel 360.

The light unit 310 comprises a light emitting apparatus 100, a control substrate 301, a reflector 330, and an optical sheet 350. Other embodiments of the light emitting apparatus can be used for the light emitting apparatus 100, e.g. apparatus 100A and 10B.

Here, the reflector 330 can be formed in an uneven shape at both sides of the light emitting apparatus 100. Accordingly, light that leaks from the light emitting apparatus to side directions is reflected to the LC panel 360 by the uneven reflector 330 disposed along both side directions (Y, Y') of the light emitting apparatus 100, so that brightness improves on the whole.

Light generated from the light emitting apparatus 100 is illuminated onto the LC panel 360 through the optical sheet 350, so that an image is displayed on the LC panel.

It will be understood that when an element is referred to as being 'on' or "under/below" another element, it can be directly on/under the element, or one or more intervening elements may also be present Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting apparatus comprising:
a first substrate comprising at least two lead frames;
a second substrate on the first substrate, wherein the second substrate comprises a first opening part exposing a portion of the first substrate, wherein the second substrate comprises a first portion and a second portion separated from each other by the first opening part, wherein the first portion of the second substrate and the second portion of the second substrate are not part of a single, continuous surface;
a light emitting device on the exposed portion of the first substrate and electrically connected to the at least two lead frames;
a first reflection frame disposed on an inner sidewall of the first portion of the second substrate and a second reflection frame disposed on an inner sidewall of the second portion of the second substrate,
wherein the first reflection frame and the second reflection frame are completely separated from each other,
wherein the first substrate is not divided into physically separate portions, and wherein the first portion of the second substrate is disposed on a first area of the first substrate, and wherein the second portion of the second substrate is disposed on a second area of the first substrate different from the first area,
wherein the first opening part is opened in an at least three different directions from a region between the first portion and the second portion of the second substrate,
wherein a portion of the first reflection frame is disposed between a top surface of the first substrate and a bottom surface of the second substrate,
wherein a portion of the second reflection frame is disposed between the top surface of the first substrate and the bottom surface of the second substrate.

2. The apparatus according to claim 1, further comprising a mold member disposed in the first opening part,
wherein the at least two lead frames are disposed on the top surface of the first substrate and the light emitting device is disposed on at least one of the at least two lead frames,
wherein a width of the mold member in the same direction as a width of the first substrate is the same as the width of the first substrate,
wherein the width of the first substrate is taken in a first horizontal direction,
wherein a length of the first substrate is taken in a second horizontal direction orthogonal to the first horizontal direction,
wherein the mold member directly contacts the first reflection frame and the second reflection frame, and
wherein each of the first and second portions of the second substrate has a width equal to that of the second substrate and equal to that of the first opening part.

3. The apparatus according to claim 2, wherein the width of the mold member in the same direction as the width of the second substrate is the same as the width of the second substrate.

4. The apparatus according to claim 1, further comprising at least one heatsink hole in at least one of the at least two lead frames.

5. The apparatus according to claim 1, further comprising an adhesive member disposed between the first substrate and the second substrate.

6. The apparatus according to claim 1, further comprising a third substrate on the second substrate and having a second opening part dividing the third substrate on the second substrate.

7. The apparatus according to claim 6, wherein the second opening part of the third substrate is the same size as or larger than the first opening part of the second substrate.

8. The apparatus according to claim 2,
wherein the mold member comprises:
a first side and a second side directly contacted with the inner sidewalls of the first and second portions of the second substrate, respectively;
a third side adjacent to the first side and spaced apart from the inner sidewalls of the first and second portions of the second substrate; and a fourth side adjacent to the second side and spaced apart from the inner sidewalls of the first and second portions of the second substrate, wherein the first side is opposite to the second side, wherein the third side is opposite to the fourth side, wherein an interval between the third side and the fourth side is the same as the width of the first substrate.

9. A light emitting apparatus comprising:

a first substrate;

a plurality of lead frames on the first substrate;

a second substrate and a third substrate spaced apart from each other on the first substrate, an opening part between the second and third substrates;

a light emitting device electrically connected to the plurality of lead frames disposed on the first substrate; and a mold member disposed on the light emitting device and between the second and third substrates, wherein the light emitting device is disposed between the second substrate and the third substrate, wherein the second and third substrates are separated from each other and are not part of a single, continuous substrate.

10. The apparatus according to claim 9, wherein the opening part is opened in an at least three different directions from a region between the second and third substrates, wherein the mold member has a width equal to that of each of the second and third substrates, wherein the width of the mold member in the same direction as a width of the first substrate is the same as the width of the first substrate, wherein the width of the first substrate is taken in a first direction, wherein a length of the first substrate is taken in a second direction orthogonal to the first direction, wherein the mold member directly contacts the second substrate and the third substrate, and wherein a width of the opening part in the first horizontal direction is the same as the width of the first substrate.

11. The apparatus according to claim 9, wherein a width of the mold member is the same as a width of the second substrate and a width of the third substrate.

12. The apparatus according to claim 9, wherein the second substrate includes a first reflection frame disposed on an inner sidewall of the second substrate, wherein the third substrate includes a second reflection frame disposed on an inner sidewall of the third substrate, and wherein the first and second reflection frames are formed of a metal material.

13. The apparatus according to claim 12, wherein the plurality of lead frames comprise a first lead frame disposed between the second substrate and the first substrate, and a second lead frame disposed between the third substrate and the first substrate, wherein the first reflection frame is electrically connected to the first lead frame and the second reflection frame is electrically connected to the second lead frame.

14. A light emitting apparatus comprising:

a first substrate;

a plurality of lead frames on the first substrate;

a plurality of second substrates spaced apart from each other on the first substrate and are not part of a single, continuous substrate, an opening part between the plurality of second substrates;

a light emitting device electrically connected to the plurality of lead frames disposed on the first substrate; and a mold member disposed on the light emitting device and between the plurality of second substrates, wherein a width of each of the plurality of second substrates is equal to that of the first substrate, and wherein the width of each of the plurality of second substrates is equal to that of the opening part.

15. The apparatus according to claim 14, wherein the opening part is opened in an at least three different directions from a region between the plurality of second substrates, wherein a width of the mold member in the same direction as a width of the first substrate is the same as the width of the first substrate, and wherein the second substrates of the plurality of second substrates are not contacted with each other and each of the second substrates of the plurality of second substrates directly contacts the mold member.

16. The apparatus according to claim 2, wherein the first and second portions of the second substrate are separated from each other.

17. The apparatus according to claim 8, wherein the first and second reflection frames are contacted with the first and second sides of the mold member and are spaced apart from the third and fourth sides of the mold member, wherein a top portion of the first reflection frame is higher than a top surface of the second substrate, and wherein a top portion of the second reflection frame is higher than the top surface of the second substrate.

18. The apparatus according to claim 9, wherein a top portion of the mold member is higher than a top surface of each of the plurality of second substrates.

19. The apparatus according to claim 18, wherein the top portion of the mold member is directly contacted with the top surface of each of the plurality of second substrates.

* * * * *